(12) United States Patent
Pellerano et al.

(10) Patent No.: US 8,198,929 B2
(45) Date of Patent: Jun. 12, 2012

(54) DYNAMIC ELEMENT MATCHING FOR TIME-TO-DIGITAL CONVERTERS

(75) Inventors: Stefano Pellerano, Beaverton, OR (US); Paolo Madoglio, Beaverton, OR (US); Ashoke Ravi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 126 days.

(21) Appl. No.: 12/872,993

(22) Filed: Aug. 31, 2010

(65) Prior Publication Data

US 2012/0049914 A1 Mar. 1, 2012

(51) Int. Cl.
*H03L 7/06* (2006.01)

(52) U.S. Cl. ........................ 327/158; 327/149

(58) Field of Classification Search .................. 327/149, 327/158

See application file for complete search history.

(56) References Cited

U.S. PATENT DOCUMENTS

| | | | | |
|---|---|---|---|---|
| 7,305,020 B2* | 12/2007 | Tran et al. | ...................... | 375/130 |
| 7,365,607 B2* | 4/2008 | Fahim | ........................... | 331/1 A |
| 7,466,207 B2* | 12/2008 | Staszewski et al. | ........... | 331/1 A |
| 8,045,670 B2* | 10/2011 | Waheed et al. | ................ | 375/376 |
| 8,050,375 B2* | 11/2011 | Staszewski et al. | ........... | 375/373 |
| 2002/0146996 A1* | 10/2002 | Bachman et al. | .............. | 455/302 |
| 2006/0193354 A1* | 8/2006 | Rosenblatt | ............... | 372/29.023 |
| 2008/0048791 A1* | 2/2008 | Fahim | ........................... | 331/1 A |
| 2008/0192876 A1* | 8/2008 | Dulger et al. | .................. | 375/376 |
| 2008/0218282 A1* | 9/2008 | Waheed et al. | ................ | 331/1 A |
| 2008/0315928 A1* | 12/2008 | Waheed et al. | ................ | 327/159 |
| 2008/0317187 A1* | 12/2008 | Waheed et al. | ................ | 375/376 |
| 2008/0317188 A1* | 12/2008 | Staszewski et al. | ........... | 375/376 |
| 2009/0262877 A1* | 10/2009 | Shi et al. | ........................ | 375/376 |
| 2010/0135368 A1* | 6/2010 | Mehta et al. | .................. | 375/219 |
| 2012/0013377 A1* | 1/2012 | Zhang et al. | .................. | 327/159 |
| 2012/0032718 A1* | 2/2012 | Chan et al. | .................... | 327/156 |

OTHER PUBLICATIONS

"Dynamic Element Matching (DEM)," presented by: Raf Karakiewicz (power point), 2003.
Weltin-Wu et al., "A 3.5GHz Wideband ADPLL with Fractional Spur Suppression Through TDC Dithering and Feedforward Compensation," 2010 IEEE International Solid-State Circuits Conference, ISSCC 2010, Session 26, High-Performance & Digital PLLs, 26.1.
Weltin-Wu et al., "A 3GHz Fractional-N All-Digital PLL with Precise Time-to-Digital Converter Calibration and Mismatch Correction," 2008 IEEE International Solid-State Circuits Conference, ISSCC 2008, Session 19, PLLs & Oscillators, 19.3.
L. Richard Carley, "A Noise-Shaping Coder Topology for 15 + Bit Converters," IEEE Journal of Solid-State Circuits, vol. 24, No. 2, Apr. 1989.

* cited by examiner

*Primary Examiner* — Lincoln Donovan
*Assistant Examiner* — Adam Houston
(74) *Attorney, Agent, or Firm* — Schwabe, Williamson & Wyatt, P.C.

(57) ABSTRACT

Embodiments of the present disclosure provide methods, systems, and apparatuses related to dynamic element matching for time-to-digital converters. Other embodiments may be described and claimed.

19 Claims, 7 Drawing Sheets

*Figure 7*

DYNAMIC ELEMENT MATCHING FOR TIME-TO-DIGITAL CONVERTERS

FIELD

Embodiments of the present disclosure relate to the field of circuits and, more particularly, to dynamic element matching for time-to-digital converters.

BACKGROUND

Phase-locked loops (PLLs) are common building blocks in wireless transceivers. They provide a reference signal used to modulate/demodulate data between baseband and radio frequencies. In a digital PLL (DPLL), the phase of a voltage-controlled oscillator (VCO) is measured by a time-to-digital converter (TDC) and compared with a high-purity, low-frequency reference inside a phase detector. The phase detector produces a digital word being equal to the error phase, which is digitally filtered and then sent to digital-to-analog converter (DAC) in order to set the control voltage of the VCO. The VCO phase is measured and filtered in the digital domain rather than in analog PLL, thus both an analog-to-digital converter (ADC) and a DAC are used. The TDC acts as an ADC inside the DPLL by measuring the VCO phase and quantizing it to produce a digital word.

Typical implementations of the TDC use a delay line or a delay-locked loop (DLL). A DLL produces an integer number of equally spaced phases by dividing the input signal period into an integer number (equal to the number of delay elements used). The phase of the input signal is measured by sampling each phase of the DLL with a reference clock, with the sampled sequence (zeros and ones) containing the information on the phase to be measured. The time resolution (e.g., the least significant bit (LSB)) of the TDC is equal to the time delay introduced by each delay element in the DLL. The finite TDC resolution introduces quantization error which, under certain conditions, can be considered as a white noise. The coarser the time resolution, the higher the quantization noise. Since the TDC noise is added in the PLL feedback path, the noise is low pass filtered by the PLL and it appears as PLL in-band noise.

Typical implementations of the TDC exhibit some mismatch between the amplitude of each LSB. As a consequence the VCO measured phase shows an error, which inherits the same periodicity of the VCO phase itself. This periodic error appears in the DPLL output signal spectrum as spurious sidebands around the carrier. These spurs limit the application of a DPLL as a frequency generator where high spectral purity is desired as the spurs are impractical to be filtered since a low-bandwidth DPLL would be needed.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

In the following detailed description, reference is made to the accompanying drawings which form a part hereof wherein like numerals designate like parts throughout, and in which is shown by way of illustration embodiments in which the disclosure may be practiced. It is to be understood that other embodiments may be utilized and structural or logical changes may be made without departing from the scope of the present disclosure. Therefore, the following detailed description is not to be taken in a limiting sense, and the scope of embodiments in accordance with the present disclosure is defined by the appended claims and their equivalents.

Various operations may be described as multiple discrete operations in turn, in a manner that may be helpful in understanding embodiments of the present disclosure; however, the order of description should not be construed to imply that these operations are order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

Various logic blocks may be introduced and described in terms of an operation provided by the blocks. These logic blocks may include hardware, software, and/or firmware elements in order to provide the described operations. While some of these logic blocks may be shown with a level of specificity, e.g., providing discrete elements in a set arrangement, other embodiments may employ various modifications of elements/arrangements in order to provide the associated operations within the constraints/objectives of a particular embodiment.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

Embodiments of the present disclosure describe a dynamic element matching (DEM) technique, which may also be referred to as a dithering technique, to suppress fractional spurs due to TDC mismatch in, e.g., a DPLL. In some embodiments, a randomized phase shift may be added before the TDC and then removed in the digital domain after the TDC. This dithering technique allows for the fractional spurs suppression without degrading the output spectrum since the introduction of the randomized phase shift breaks the periodicity of the VCO phase, thus the periodicity of the phase error due to the TDC mismatch, and the same phase shift is then removed in the digital phase domain after the TDC.

Figure 1:
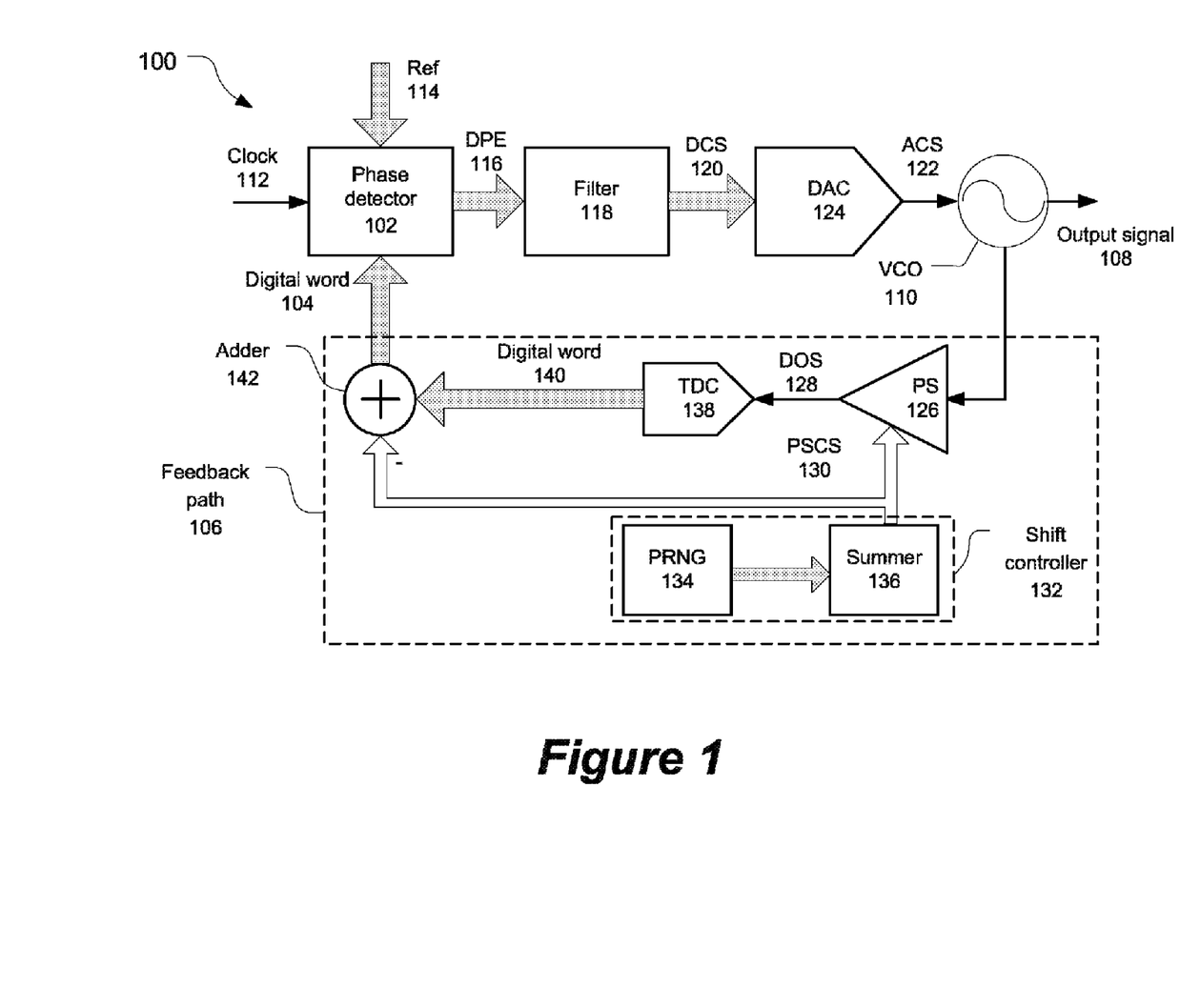
FIG. 1 illustrates a digital phase-locked loop in accordance with some embodiments.

FIG. 1 illustrates a DPLL 100 in accordance with some embodiments. The DPLL 100 may include a phase detector 102 that receives a digital word 104, from a feedback path 106, representing a phase of an output signal 108 output by VCO 110. The phase detector 102 may also receive a clock signal 112 and a reference digital word (Ref) 114. The phase detector 102 may generate and output a digital phase error (DPE) 116 based on the differences between the digital word 104 and the reference digital word 114. In the figures, the block arrows indicate a digital signal, while line arrows indicate an analog signal.

The digital phase error 116 may be filtered at filter 118 to generate a digital control signal (DCS) 120. The digital control signal 120 may be converted to an analog control signal (ACS) 122 by a DAC 124. The analog control signal 122 may be provided to the VCO 110 to adjust the phase of the output signal 108.

The output signal 108 may be provided to a phase shifter (PS) 126 of the feedback path 106. The phase shifter 126 may dither the output signal 108 by, e.g., providing a randomized phase shift to the output signal 108, to provide a dithered, or delayed output signal (DOS) 128. The amount of the randomized phase shift provided by the phase shifter 126 may be controlled by a digital phase shift control signal (PSCS) 130 that is provided to the phase shifter 126 by shift controller 132. The shift controller 132 may include a pseudo-random number generator (PRNG) 134 and a summer 136.

The phase shifter 126 may be coupled with, and provide the delayed output signal 128 to, a TDC 138. The TDC 138 may include a DLL and may generate a digital word 140 that represents a phase of the delayed output signal 128. The feedback path 106 may further include an adder 142 coupled with the TDC 138 and the shift controller 132. The adder 142 may generate the digital word 104 based on the digital word 140 and the phase-shift control signal 130 and provide the digital word 104 to the phase detector 102. By receiving the phase shift control signal 130 from the shift controller 132, the adder 142 may have accurate knowledge of the amount of randomized phase shift provided by the phase shifter 126 to the delayed output signal 128. Thus, the adder 142 may be able to accurately remove the amount of randomized phase shift such the digital word 104 represents the phase of the output signal 108, rather than the phase of the delayed output signal 128, which is represented by the digital word 140.

Figure 2:
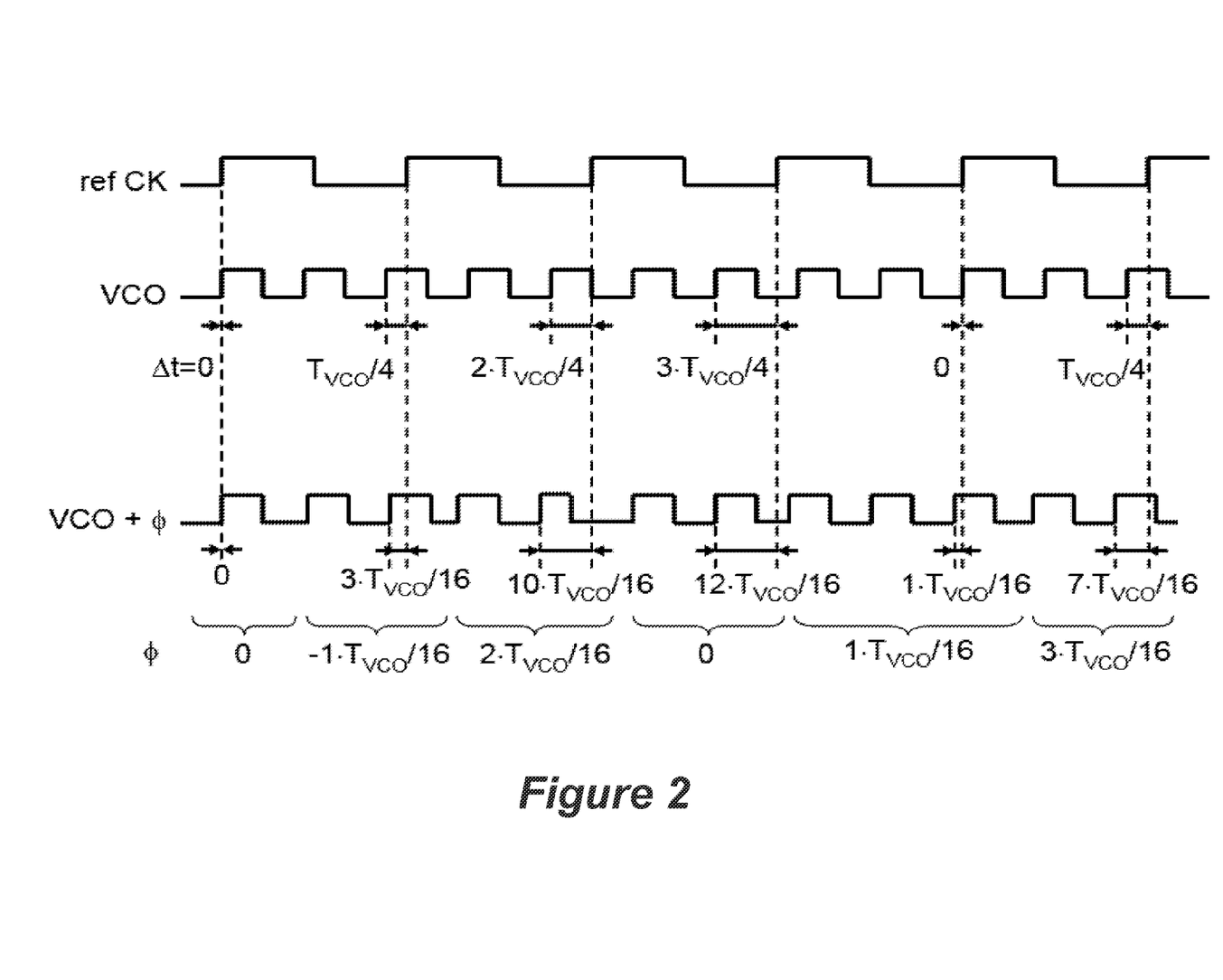
FIG. 2 shows various waveforms depicting operation of a digital phase-locked loop in accordance with some embodiments.

How the above-described dithering technique breaks the periodicity of the VCO phase may be illustrated by reference to the waveforms depicted in FIG. 2. FIG. 2 shows waveforms of a reference clock, a VCO signal (e.g., a digital representation of the output signal 108), and a VCO+φ signal (e.g., a digital representation of the delayed output signal 128) in accordance with various embodiments. T_VCO represents a period of the VCO signal. With the frequency of the VCO signal divided by the frequency of the reference clock being equal to 2.25, the phase of the VCO signal may repeat after four samples. The addition of randomized φ values as shown, causes the VCO+φ signal to lose its periodicity and, therefore, not repeat every four-sample period. The specific φ values that are shown do not restrict φ values in other embodiments.

Figure 3:
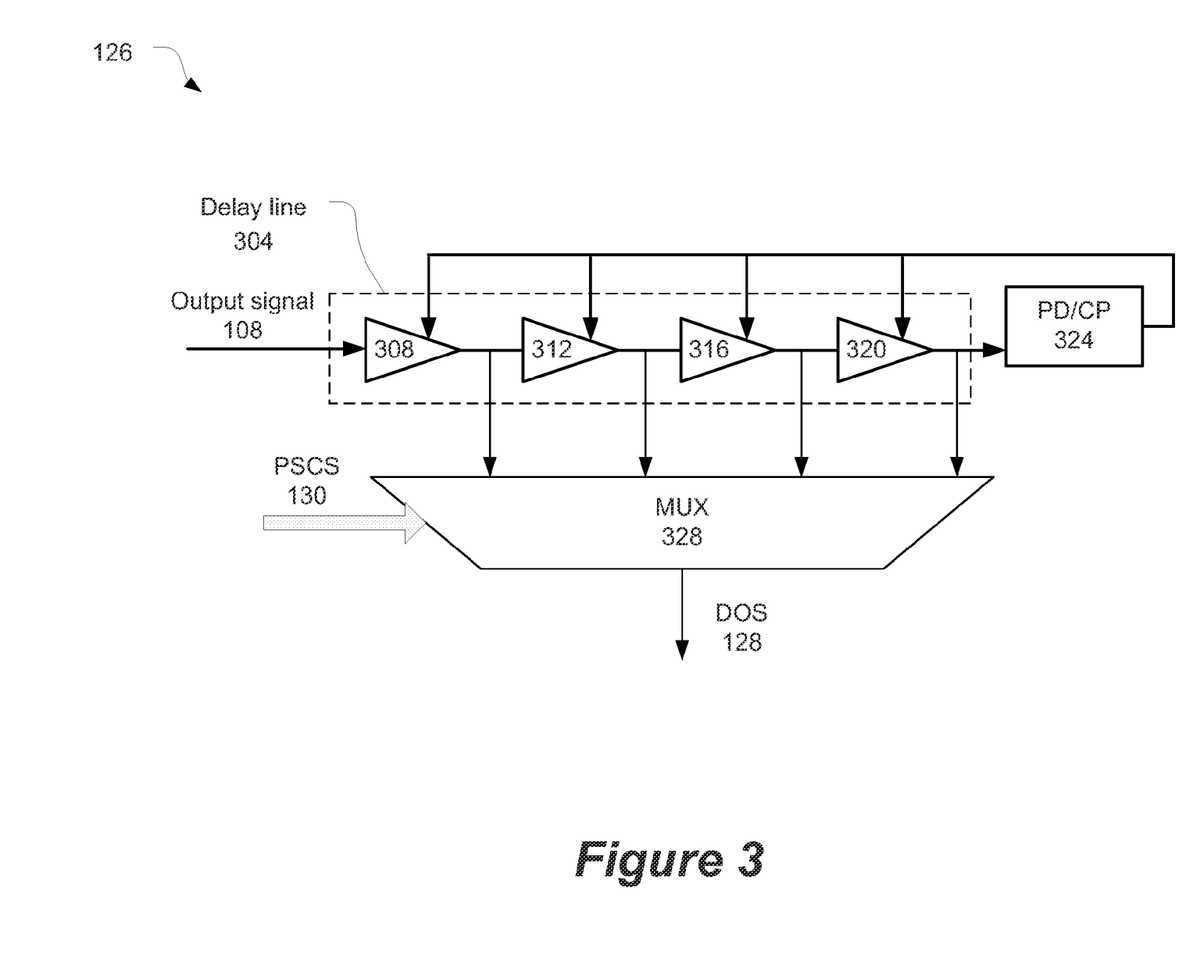
FIG. 3 illustrates a phase shifter in accordance with some embodiments.

FIG. 3 illustrates the phase shifter 126 in accordance with various embodiments. The phase shifter 126 may include a delay line 304 with a plurality of delay elements, e.g., delay elements 308, 312, 316, and 320, coupled with one another in series, through which the output signal 108 will be propagated. While FIG. 3 shows four delay elements, it is understood that any number of delay elements may be used. The delay line 304 may be coupled with a phase detector (PD)/charge pump (CP) 324 that provides a control signal to each of the delay elements of the delay line 304 so that each of the delay elements provides an equal phase delay (or simply "delay") of, e.g., 90 degrees. In general, the phase delay provided by each delay element of a DLL may be determined by dividing the total signal period, e.g., 360 degrees, by the number of delay elements.

Taps following each delay element may be coupled with a multiplexer (MUX) 328 as inputs that respectively represent the output signal delayed by a different number of delays. For example, the first tap may provide the MUX 328 with the output signal 108 delayed by one delay, the second tap may provide the MUX 328 with the output signal 108 delayed two delays, etc. The MUX 328 may select one of the inputs for output as the delayed output signal 128 based on the phase-shift control signal 130 received from the shift controller 132. In this manner, a phase shift introduced to the output signal 108 may be randomized among a discrete set of known values, yet knowledge of the discrete set of values (and the selected input) may allow the adder 142 to accurately remove the introduced phase shift prior to providing the digital word 104 to the phase detector 102. Removal of the introduced phase shift in the digital domain may facilitate accurate removal. In this manner, the dithering technique may break the periodicity without constituting an additional noise source for the DPLL 100.

Figure 4:
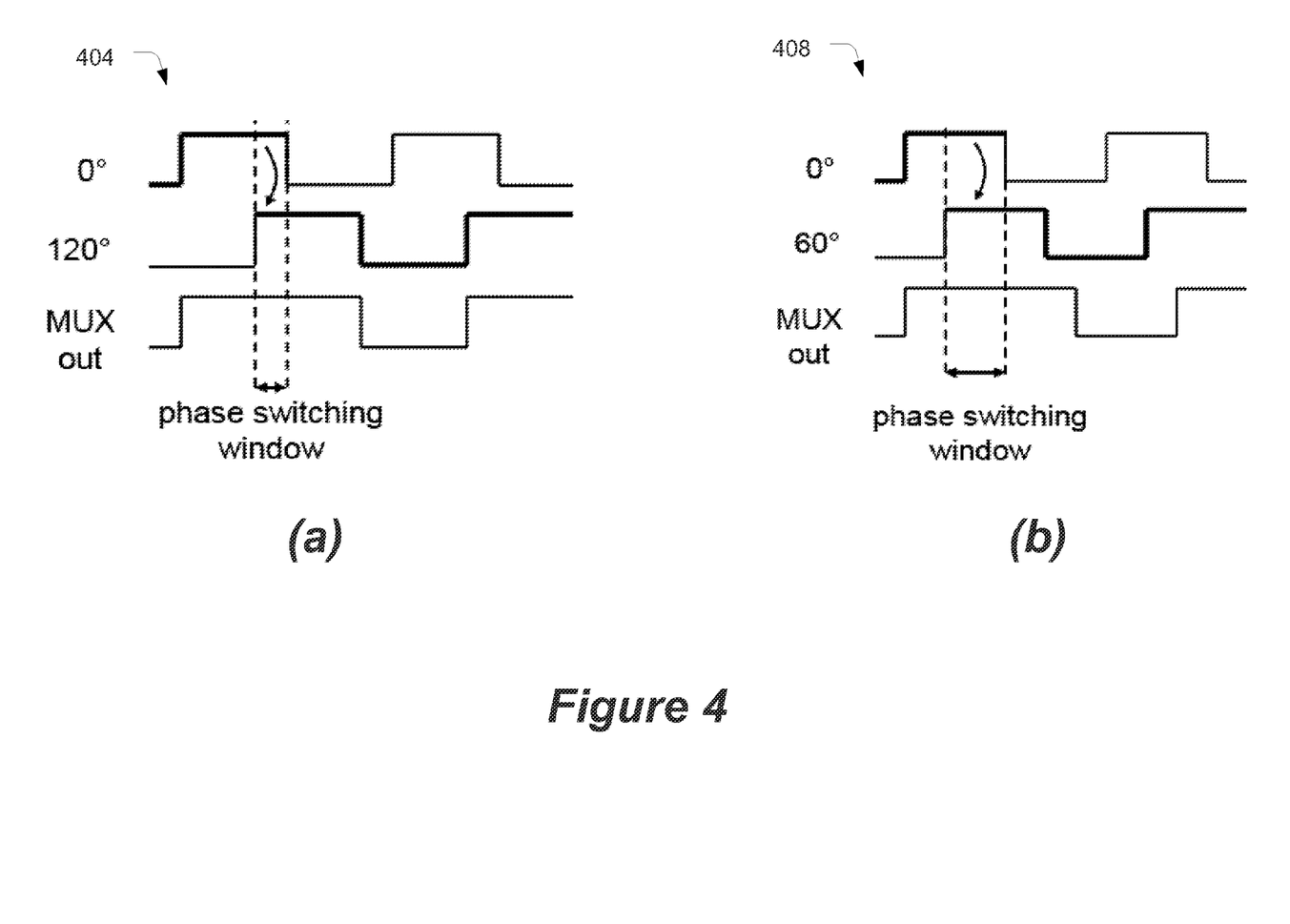
FIGS. 4a-4b show waveforms illustrating respective phase switching windows in accordance with some embodiments.

In some embodiments, it may be desirable for the whole dynamic range (as phase) of the TDC 138 to be exercised by the additional phase shift added by the MUX 328 in order to get an effective dynamic element matching over the TDC 138. However, as shown in FIGS. 4*a-b*, it may also be desirable for a randomized phase shift to be limited in magnitude. FIGS. 4*a-b* provide waveforms 404 and 408 respectively illustrating introductions of phase shifts of 120 degrees and 60 degrees in accordance with various embodiments. To avoid glitches, it may be desirable to switch from one phase to another when both signals have the same logic value. As can be seen from FIGS. 4*a-b*, switching from 0 degrees to 120 degrees provides a significantly smaller window in which the phase switch may be performed (phase-switching window), as compared to switching from 0 degrees to 60 degrees.

In order to exercise the whole dynamic range of the TDC 138, while limiting the magnitude of the phase shift, the shift controller 132 may use the running sum of a PRNG sequence to drive the MUX 328 and thus provide a random walk through the entire range of possible phase shifts.

Consider, for example, an embodiment in which the MUX 328 had ten inputs, thus, enabling ten different phase shifts to be applied. In one embodiment, it may be desirable to limit the phase shift to 3 delay phases. That is, the first phase shift may include 0, 1, 2, or 3 delay phases; the second phase shift may have 0, 1, 2, or 3 delay phases added to the first phase shift; and so on.

The PRNG 134 and the summer 136 may cooperatively implement the above-described random walk as follows. The PRNG may generate a pseudo-random number (PRN) from a number of possible values that corresponds to the number of delay phases to which the phase shift may be limited. In some embodiments, the number of possible values may be one greater than the number of delay phases to which the phase shift may be limited to accommodate the possibility that no delay phase is added. The number of possible values will be less than the total number of inputs to the MUX 328. In the above example, the PRNG 134 may be used to generate a sequence with a uniform randomized distribution from 0-3. The summer 136 may be a modulo-M adder that implements a modulo-M operation, where M is in the number of phases coming to the MUX 328. The summer 136 may receive the PRN and add the PRN to the previous selection. Even if the PRNG 134 were to produce a sequence having low variance, the running sum will span all the possible M-levels and its variance will increase with time. Moreover, the consecutive phase shifts may be kept small, e.g., less than 90 degrees, due to the relatively small number of possible values of the PRNG output.

Figure 5:
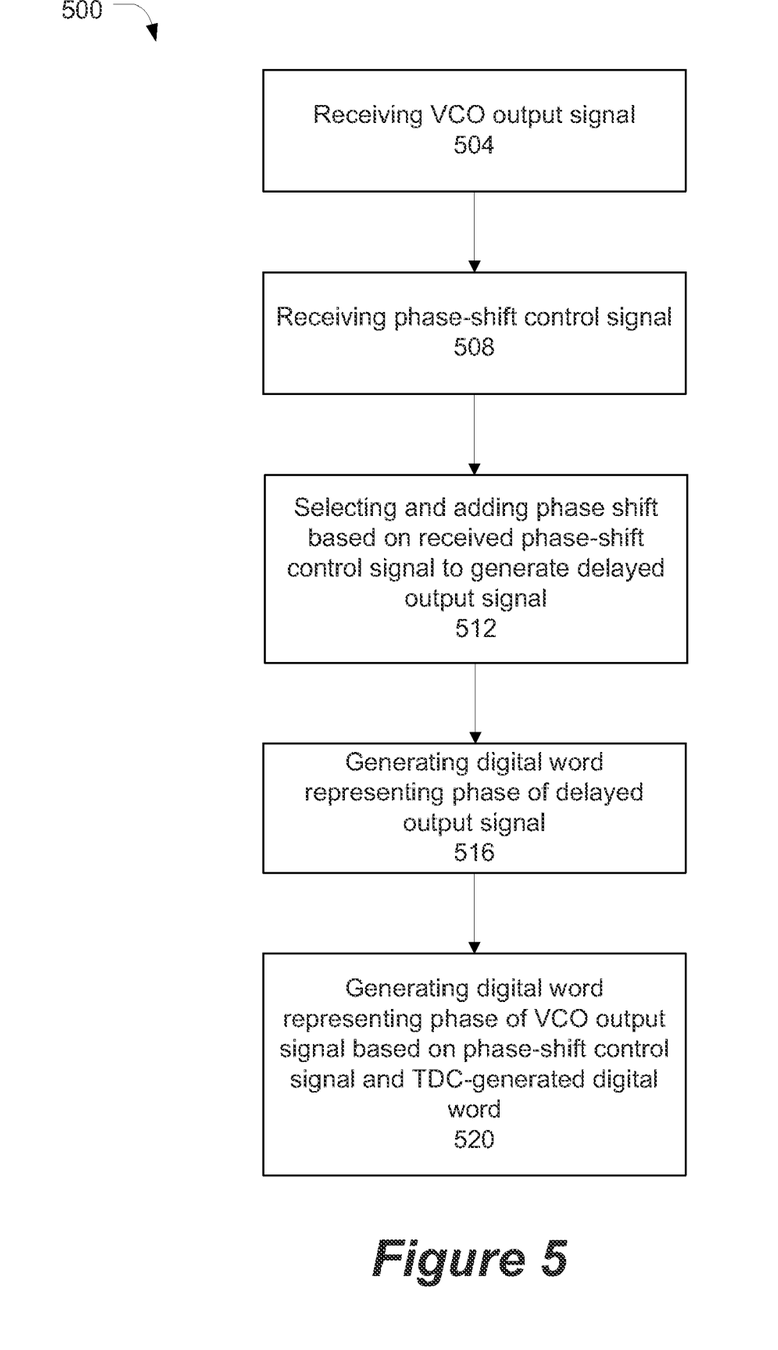
FIG. 5 is a flowchart showing an operation of a digital phase-locked loop in accordance with some embodiments.

FIG. 5 illustrates a flowchart 500 describing operation of the feedback path 106 of the DPLL 100 in accordance with some embodiments. At block 504, the operation may include receiving, e.g., by the phase shifter 126, the VCO output signal 108.

At block 508, the operation may include receiving, e.g., by the phase shifter 126, the phase-shift control signal 130 from the shift controller 132. The operation may then include, at block 512, selecting and adding, e.g., by the phase shifter 126, a phase shift from a discrete set of possible phase shifts based on the received phase-shift control signal. The phase-shifter 126 may provide the discrete set of possible phase shifts by inputting the VCO output signal 108 through a DLL as described above. A MUX 328 of the phase shifter 126 may output the delayed output signal 128.

At block 516, the operation may include generating, e.g., by the TDC 138, a digital word 140 representing a phase of the delayed output signal 128. The TDC 138 may include a DLL to facilitate generation of the digital word 140.

At block 520, the operation may include generating, e.g., by the adder 142, a digital word representing a phase of the VCO output signal based on the phase-shift control signal 130 and the digital word 140. As described above, the phase shift added by the phase shifter 126 may be removed by the adder 142.

Figure 6:
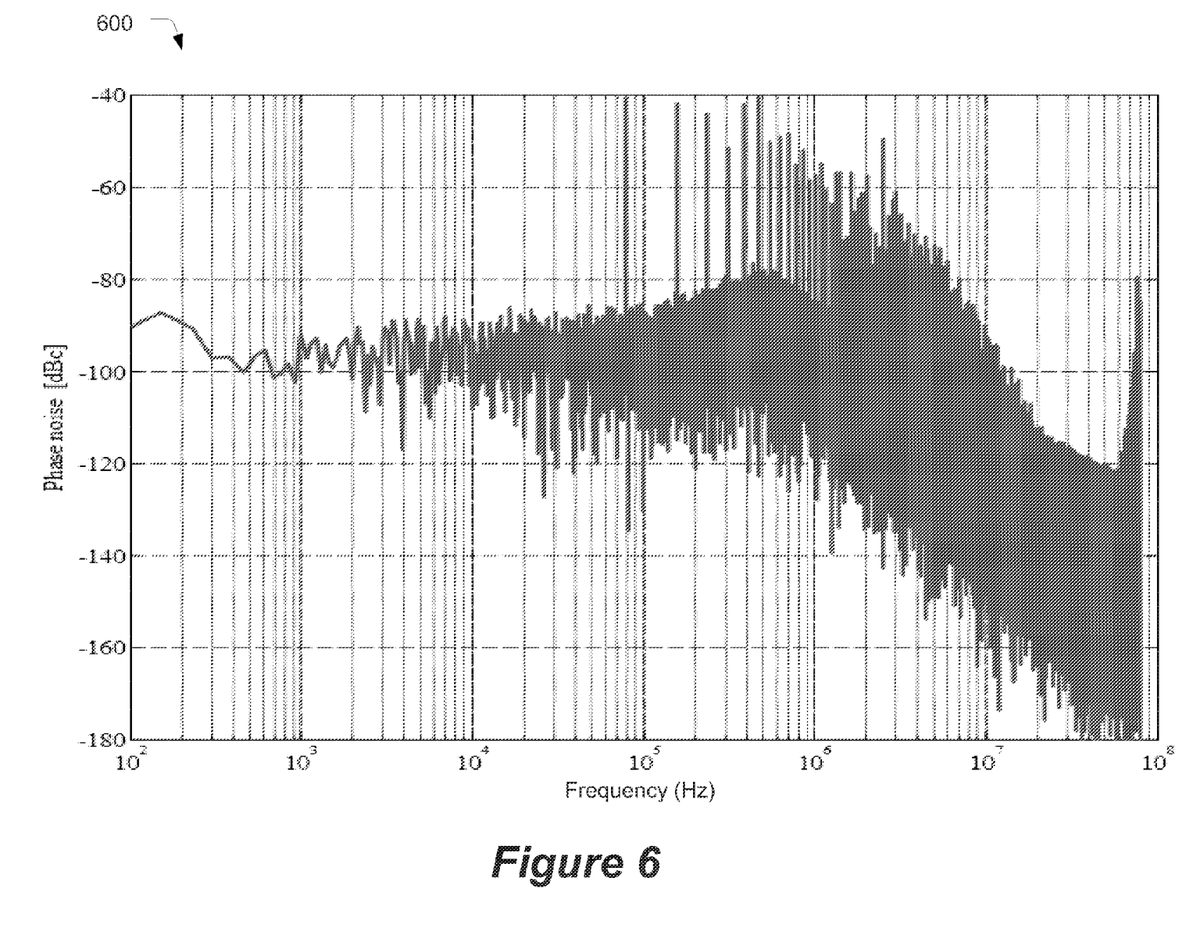
FIG. 6 is a chart depicting phase noise as a function of frequency associated with a prior art digital phase-locked loop.
Figure 7:
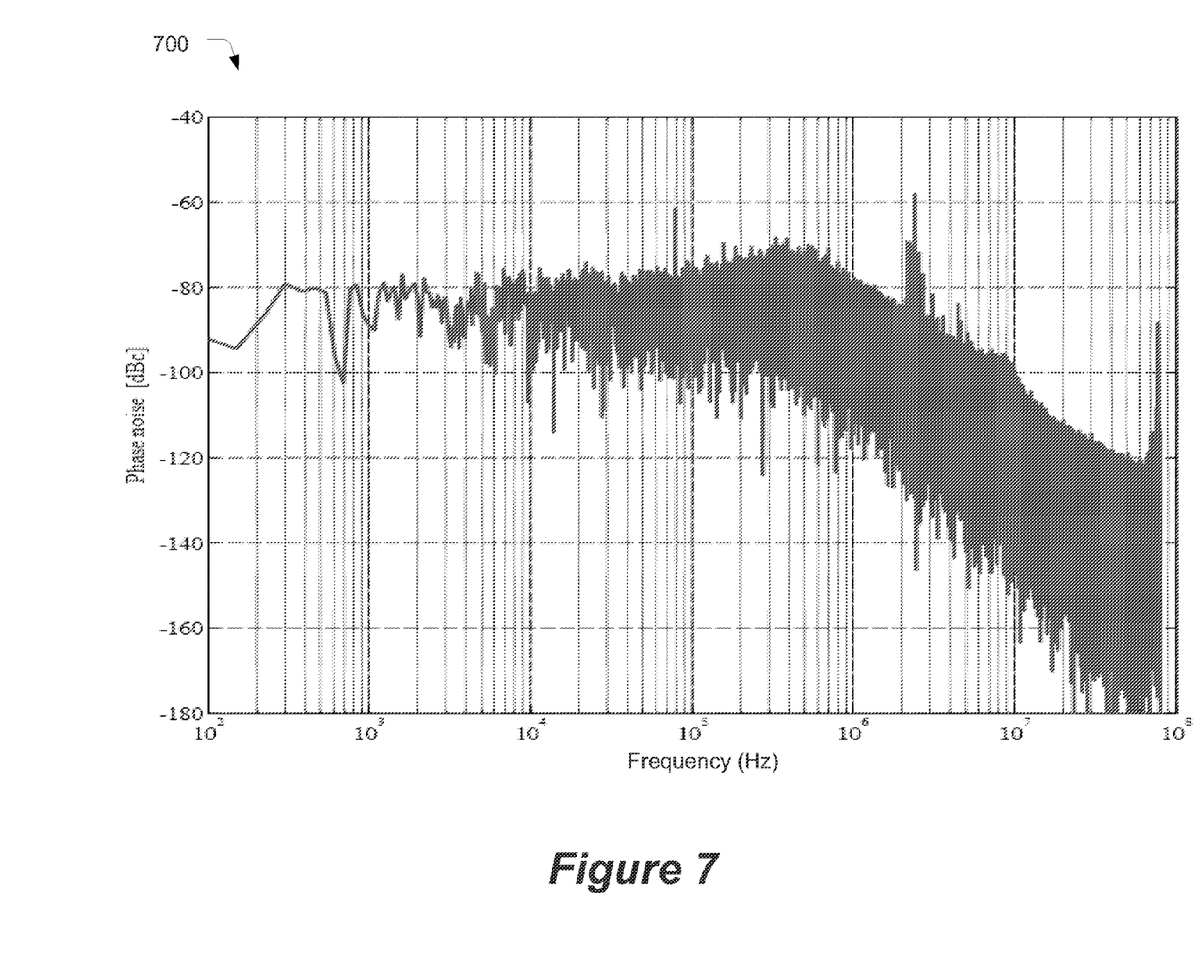
FIG. 7 is a chart depicting phase noise as a function of frequency associated with a digital phase-locked loop in accordance with some embodiments.

FIGS. 6 and 7 respectively illustrate charts 600 and 700 depicting phase noise as a function of frequency. Chart 600 is associated with a prior art DPLL, while chart 700 is associated with a DPLL in accordance with embodiments of the present invention. Values common to both charts include:

DPLL reference frequency of 80 megaHertz (MHz) and a fractional number, N, of 60+1/1024, thus, the output frequency is 4800.078125 MHz, while spurs may appear at 78.125 kilohertz (kHz) and its multiples;

DPLL loop bandwidth of approximately 1 MHz;

delay of each delay cell of the DLL of the TDC generated using a Gaussian distribution with a variance of 1 picosecond; and frequency bins of 76 Hz.

With respect to chart 700, the number of inputs to a MUX of a phase shifter is 32 and a PRNG sequence generates a uniform distribution from 0-7, which may result in maximum phase shift of approximately 7/32*360=79 degrees.

Chart 600 shows that the output spectrum exhibits spurs as high as −39 decibels relative to the carrier (dBc). In chart 700, on the other hand, the fractional spurs lower to −58 dBc. Moreover, the total phase noise integrated inside the transmission channel (100 Hz to 10 MHz) is −31.7 dBc in a prior art DPLL and −38.8 dBc with a DPLL, e.g., DPLL 100, using the dithering techniques disclosed herein. Thus, the DPLL 100 may reduce fractional spurs by 18 dB and the integrated phase noise by 7 dB compared to a prior art DPLL.

The disclosed dynamic element matching technique works in the background to suppress fractional spurs. The disclosed embodiments do not require a modification to a TDC used in a feedback path of a DPLL and they do not have inherent bandwidth limitations since they do not attempt to compensate for mismatch of each TDC delay element. Still further, the disclosed embodiments provide insensitivity to process, voltage and temperature (PVT) variations since the DLL of the phase shifter automatically tracks any PVT variations associated with the DLL of the TDC. Embodiments of the present disclosure do not require calibrations when the DPLL frequency is adjusted; rather, the DLL of the phase shifter will automatically settle over a relatively short amount of time, e.g., within a few microseconds.

While disclosed embodiments discuss the DEM techniques with respect to specific circuits, e.g., DPLL 100 with DLL-based TDC 138, other embodiments may use the disclosed DEM techniques with other circuits. For example, the disclosed DEM techniques may be used with non-DLL based TDCs; may be used with digitally controlled oscillator, rather than a VCO; etc.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present disclosure. Similarly, memory devices of the present disclosure may be employed in host devices having other architectures. This application is intended to cover any adaptations or variations of the embodiments discussed herein. Therefore, it is manifestly intended that embodiments in accordance with the present disclosure be limited only by the claims and the equivalents thereof.

What is claimed is:

1. A circuit comprising:
a phase shifter having a delay-locked loop (DLL) and configured to receive an analog output signal and to provide a randomized phase shift to the analog output signal to provide a delayed output signal;
a time-to-digital converter (TDC) coupled with the phase shifter, the TDC configured to generate a first digital word that represents phase information of the delayed output signal; and
an adder coupled with the TDC and configured to generate a second digital word based on the first digital word and the randomized phase shift.

2. The circuit of claim 1, further comprising:
a shift controller coupled with the adder and the phase shifter, the shift controller configured to provide the phase shifter and the adder with a phase-shift control signal.

3. The circuit of claim 2, wherein the shift controller comprises:
a pseudo-random number generator (PRNG) configured to generate a sequence; and
a summer coupled with the PRNG and configured to generate the phase-shift control signal based on the sequence.

4. The circuit of claim 3, wherein the PRNG and the summer are configured to cooperatively implement a random walk across an entire range of possible phase shifts.

5. The circuit of claim 4, wherein the phase shifter includes a multiplexer configured to receive M inputs from the first DLL and the summer is a modulo-M adder.

6. The circuit of claim 5, wherein the PRNG is configured to generate a number from N possible values, where N is less than M.

7. The circuit of claim 4, wherein the randomized phase shift is limited to ninety degrees or less.

8. The circuit of claim 1, wherein the DLL is a first DLL and the TDC includes a second DLL.

9. A method comprising:
receiving an output signal from an oscillator;
receiving a phase-shift control signal;
selecting and adding a randomized phase shift to the output signal to generate a delayed output signal based on the phase-shift control signal; and generating a digital word representing a phase of the output signal based on the randomized phase shift.

10. The method of claim 9, further comprising:
generating the phase-shift control signal by generating a pseudo-random number from a first plurality of possible values; and
selecting the randomized phase shift from a second plurality of phase shifts based on the pseudo-random number.

11. The method of claim 10, wherein the second plurality is greater than the first plurality.

12. The method of claim 11, wherein the second plurality is M, the method further comprising:
adding, in a modulo-M operation, the pseudo random to a running sum; and
selecting the randomized phase shift from the second plurality of phase shifts based on the running sum.

13. The method of claim 9, wherein the digital word is a first digital word and the method further comprises:
generating a second digital word representing the phase of the delayed output signal; and
generating the first digital word based on the randomized phase shift and the second digital word.

14. The method of claim 9, wherein said selecting and adding a randomized phase shift comprises:
propagating the output signal through a delay-locked loop of a phase shifter; and
providing, to a multiplexer, a plurality of signals that represent the output signal provided with a plurality of different delay phases; and
selecting, with the multiplexer, the randomized phase shift from the plurality of signals.

15. A digital phase-locked loop comprising:
a voltage-controlled oscillator (VCO) configured to provide an output;
a phase shifter having a first delay-locked loop (DLL) and configured to receive the output from the VCO and to dither the output to provide a dithered output signal;
a time-to-digital converter (TDC) having a second DLL and coupled with the phase shifter, the TDC configured to generate a first digital word that represents phase information of the dithered output signal;
an adder coupled with the TDC and configured to generate a second digital word based on the first digital word and the randomized phase shift; and
a phase detector coupled with the adder and configured to generate a digital phase error based at least in part on the second digital word and a reference digital word.

16. The digital phase-locked loop of claim 15, further comprising:
a shift controller coupled with the adder and the phase shifter, the shift controller configured to provide the phase shifter and the adder with a phase-shift control signal.

17. The digital phase-locked loop of claim 16, wherein the shift controller comprises:
a pseudo-random number generator (PRNG) configured to generate a sequence; and
a summer coupled with the PRNG and configured to generate the phase-shift control signal based on the sequence, wherein the PRNG and the summer are configured to cooperatively implement a random walk across an entire range of possible phase shifts.

18. The digital phase-locked loop of claim 17, wherein the phase shifter includes a multiplexer configured to receive M inputs from the first DLL and the summer is a modulo-M adder.

19. The digital phase-locked loop of claim 18, wherein the PRNG is configured to generate a number from N possible values, where N is less than M.

* * * * *